(12) United States Patent
Van Laanen

(10) Patent No.: US 6,674,774 B1
(45) Date of Patent: Jan. 6, 2004

(54) CHOPPED LASER DRIVER FOR LOW NOISE APPLICATIONS

(75) Inventor: Peter Joseph Van Laanen, Boulder, CO (US)

(73) Assignee: Infineon Technologies North America Corp., San Jose, CA (US)

(*) Notice: Subject to any disclaimer, the term of this patent is extended or adjusted under 35 U.S.C. 154(b) by 0 days.

(21) Appl. No.: 09/569,084

(22) Filed: May 10, 2000

(51) Int. Cl.[7] .............................. H01S 3/00; H03B 5/24
(52) U.S. Cl. ........................ 372/38.02; 372/38.07; 331/57
(58) Field of Search ................... 331/57; 327/109; 372/38.02, 38.03, 38.07, 29.015

(56) References Cited

U.S. PATENT DOCUMENTS

| | | |
|---|---|---|
| 5,357,217 A | 10/1994 | Marchesi et al. |
| 5,767,704 A | 6/1998 | Larson |
| 5,808,325 A * | 9/1998 | Webb ........................... 257/99 |
| 5,850,195 A * | 12/1998 | Berlien et al. ............... 341/137 |
| 5,883,910 A * | 3/1999 | Link ........................ 372/38.07 |
| 6,025,756 A | 2/2000 | Miyabe |
| 6,252,452 B1 * | 6/2001 | Hatori et al. ................. 327/544 |
| 6,335,895 B1 * | 1/2002 | Sugibayashi ................ 365/227 |
| 6,339,357 B1 * | 1/2002 | Yamasaki et al. ............ 327/538 |
| 6,348,368 B1 * | 2/2002 | Yamazaki et al. ........... 438/166 |
| 6,362,769 B1 * | 3/2002 | Hovin et al. ................. 341/157 |
| 6,365,933 B1 * | 4/2002 | Yamazaki et al. ........... 257/347 |
| 6,373,341 B1 * | 4/2002 | Morgan ........................ 331/57 |

FOREIGN PATENT DOCUMENTS

| | | |
|---|---|---|
| EP | 0 569 658 A1 | 11/1993 |
| EP | 0 762 574 A1 | 3/1997 |
| JP | 3-185637 | 8/1991 |

* cited by examiner

*Primary Examiner*—Paul Ip
*Assistant Examiner*—James Menefee
(74) *Attorney, Agent, or Firm*—Fish & Richardson P.C.

(57) ABSTRACT

A circuit (10) for driving a laser diode (12) includes a fixed current source (14), a programmable current source (16), a differential output driver (18), a phase splitter (20), and a ring oscillator (22). The fixed current source (16) is always coupled to the laser diode (12) and supplies a few milliamperes (well below the current required to make the diode lase) in order to maintain forward voltage on the laser (12). The programmable current source (16) is alternately coupled to the anode (12a) and the cathode (12b) of the laser diode (12) by the differential output driver (18) in response to signals from the phase splitter (20). The phase splitter (20) changes phase at a frequency controlled by the ring oscillator (22). According to a presently preferred embodiment, a 25% duty cycle in the ring oscillator (22) keeps the laser diode (12) ON for 75% of the time. The frequency of the laser diode (12) is nominally 300–500 Mhz. The circuit (10) of the invention is preferably implemented as an integrated circuit chip (30) which is mounted in die form very close to the laser diode (12) in a leadframe package (32) together with all of the photodetectors (38) needed for using the laser diode (12) to read or guide the reading/writing of disks.

14 Claims, 2 Drawing Sheets

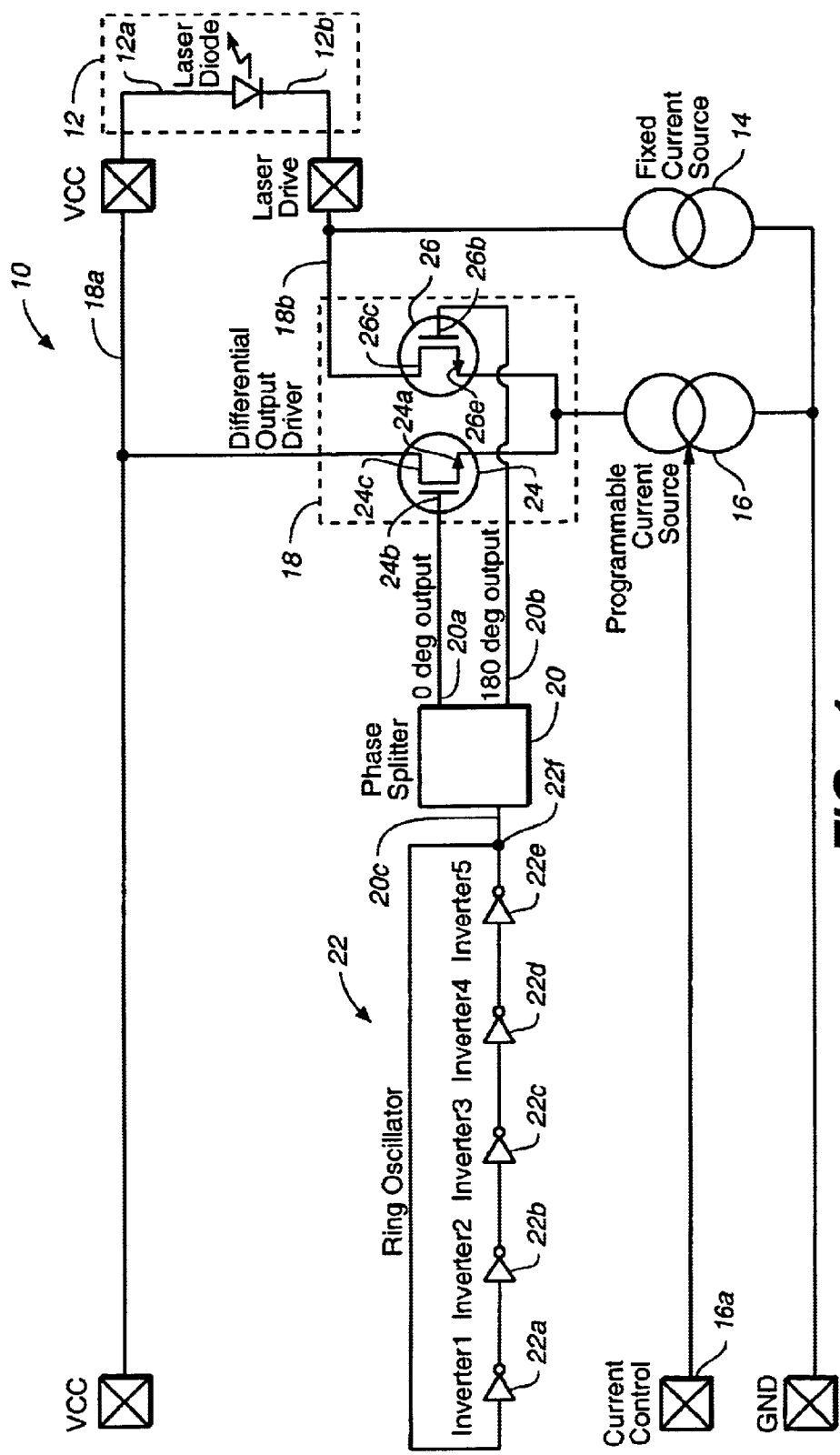
FIG._1

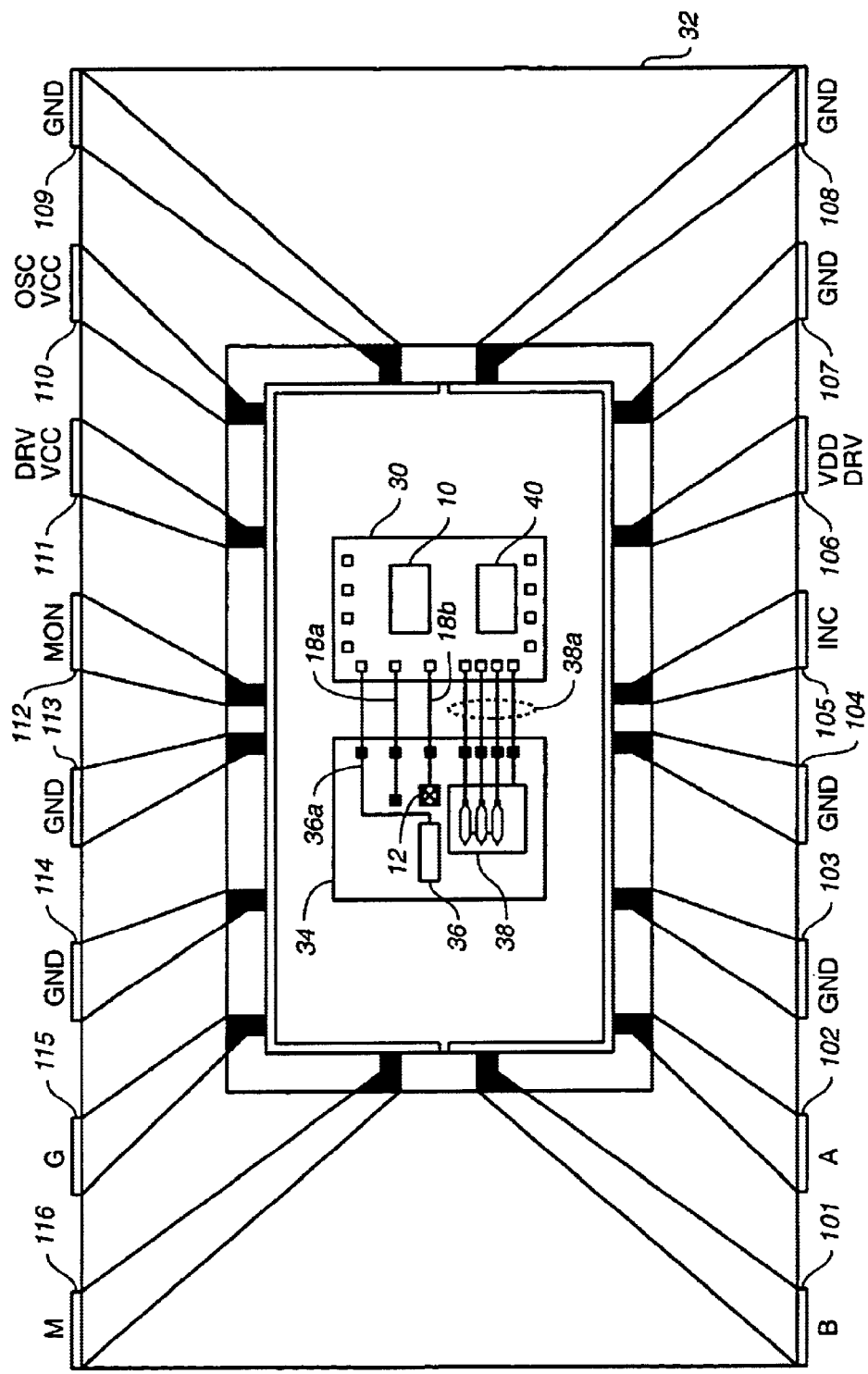
FIG._2

CHOPPED LASER DRIVER FOR LOW NOISE APPLICATIONS

BACKGROUND OF THE INVENTION

1. Field of the Invention

The invention broadly relates to lasers. More particularly, the invention relates to circuits for powering laser diodes in low noise applications.

2. Brief Description of the Prior Art

All lasers use the principle of amplification of electromagnetic waves by stimulated emission of radiation. The term laser is an acronym for light amplification by stimulated emission of radiation.

The process of stimulated emission can be described as follows. When atoms, ions, or molecules absorb energy, they can emit light spontaneously (as in an incandescent lamp) or they can be stimulated to emit by a light wave. If a collection of atoms is pumped so that more are initially excited than unexcited, then an incident light wave will stimulate more emission than absorption, and there is a net amplification of the incident light beam. This is the way a laser amplifier works.

A laser amplifier can be made into a laser oscillator by arranging suitable mirrors on either end of the amplifier to form a resonator. Thus, the essential parts of a laser oscillator are an amplifying medium, a source of pump power, and a resonator. Radiation that is directed straight along the axis bounces back and forth between the mirrors and can remain in the resonator long enough to build up a strong oscillation. Radiation may be coupled by making one mirror partially transparent so that part of the amplified light can emerge through it.

The fundamental light-producing mechanism in an injection diode laser is the recombination of excess conduction-band electrons and valence-band holes. This recombination operation takes place by pumping excess carriers across a junction. That is, excess electrons are injected from a semiconductor n-layer and excess holes from a semiconductor p-layer into an active waveguide region, where they recombine, via stimulated emission, producing the desired gain. The lasing threshold is reached when optical loss is balanced by optical gain. Thus, lasing is driven by current.

Laser diodes are used in a variety of applications including data storage and retrieval with optical disks and magneto-optical disks. In these applications, laser light is reflected from the surface of a rotating disk. Depending on various ambient factors such as temperature, humidity, disk speed, and the condition of the surface of the disk, an element of noise may be coupled to the reflected light. In order to minimize noise, it is common to utilize an RF oscillator in conjunction with the laser current driver so that the laser light oscillates at a frequency which is much higher than that of the data.

There are several disadvantages to using an RF oscillator. These include low efficiency and unwanted high frequency radiation. The oscillators are inefficient because an inductor is required to decouple the current source so that only the laser is driven. Approximately 50% of the current is thereby wasted. The RF interference can interfere with the operation of the laser as well as nearby electrical components. Consequently, the RF oscillator must be mounted on the back of the laser diode package. Laser diodes driven by RF oscillators must also be certified by the Federal Communications Commission (FCC) for use in the United States. This can be costly and time consuming.

Self-pulsated lasers have been used as an alternative to using an RF oscillator in applications requiring only low power lasers. However, self-pulsating lasers are usually even less efficient than the RF oscillator and laser arrangement. Moreover, self-pulsating lasers generate undesirable heat.

SUMMARY OF THE INVENTION

It is therefore an object of the invention to provide a circuit for driving a laser diode.

It is also an object of the invention to provide a circuit for driving a laser diode which is highly efficient.

It is another object of the invention to provide a circuit for driving a laser diode which has low RF radiation emission.

It is still another object of the invention to provide a circuit for driving a laser diode which is low in cost.

It is yet another object of the invention to provide a circuit for driving a laser diode which has fewer components than conventional circuits.

It is also an object of the invention to provide a circuit for driving a laser diode which does not need to be certified by the FCC.

It is another object of the invention to provide a circuit for driving a laser diode which can be mounted very close to the laser diode.

It is yet another object of the invention to provide a circuit for driving a laser diode which does not generate undesirable heat.

It is still another object of the invention to provide a circuit for driving a laser diode which causes the laser to have a duty cycle greater than 50% and yet still operate in a multiple wavelength mode.

It is yet another object of the invention to provide a circuit for driving a laser diode which maintains a constant total current.

It is also an object of the invention to provide a circuit for driving a laser diode which can be mounted in die form very close to the laser diode.

It is another object of the invention to provide a single integrated circuit package which contains the laser diode and the circuit for driving the laser diode.

In accord with these objects which will be discussed in detail below, the circuit for driving the laser diode according to the present invention includes a fixed current source, a programmable current source, a differential output driver, a phase splitter, and a ring oscillator. The fixed current source is always coupled to the laser diode and supplies a few milliamperes (well below the current required to make the diode lase) in order to maintain forward voltage on the laser. The programmable current source is alternately coupled to the anode and the cathode of the laser diode by the differential output driver in response to signals from the phase splitter. The phase splitter changes phase at a frequency controlled by the ring oscillator.

The ring oscillator is made from an odd number of current inverters coupled in a loop. One of the current inverters is provided with hysteresis which is used to provide duty cycle control by making the previous current inverter have a different slew rate for high to low transition than from low to high transition. According to a presently preferred embodiment, a 25% duty cycle in the ring oscillator keeps the laser diode ON for 75% of the time. The frequency of the laser diode is nominally 300–500 Mhz.

The phase splitter provides two output signals which are substantially 180 degrees out of phase with each other.

When one is high, the other is low and they change at exactly the same time in response to the output of the ring oscillator.

The differential output driver includes two switching transistors which are driven (via their gate connections) by the outputs of the phase splitter such that one transistor is OFF when the other is ON and they change at exactly the same time. More particularly, the gate of the first transistor is coupled to the first output of the phase splitter and the drain of the first transistor is coupled to the anode of the laser diode. The gate of the second transistor is coupled to the second output of the phase splitter and the drain of the second transistor is coupled to the cathode of the laser diode. The sources of both transistors are coupled to the programmable current source.

According to a presently preferred embodiment, the circuit of the invention is implemented as an integrated circuit chip which is mounted in die form very close to the laser diode in a leadframe package. The very short connections between the circuit and the laser diode minimize RF emissions. According to this embodiment, the leadframe package also includes all of the photodetectors needed for using the laser diode to read disks.

Additional objects and advantages of the invention will become apparent to those skilled in the art upon reference to the detailed description taken in conjunction with the provided figures.

BRIEF DESCRIPTION OF THE DRAWINGS

FIG. 1 is a simplified schematic diagram of a circuit for driving a laser diode according to the invention; and FIG. 2 is a simplified schematic diagram of a leadframe package containing a laser diode, photo detectors, the circuit of FIG. 1 and other circuits for driving the laser diode and detecting reflected light from a data disk.

DETAILED DESCRIPTION

Referring now to FIG. 1, a circuit 10 for driving a laser diode 12 includes a fixed current source 14, a programmable current source 16, a differential output driver 18, a phase splitter 20, and a ring oscillator 22. The anode 12a of the laser diode 12 is always coupled to Vcc. The fixed current source 14 is always coupled to the cathode 12b of the laser diode 12. The fixed current source 14 supplies the laser diode 12 with a charge current of a few milliamperes (well below the current required to make the diode lase). This current maintains the forward voltage on the laser so there is minimal voltage swing at the chop frequency. The programmable current source 16 is alternately coupled to the anode 12a and the cathode 12b of the laser diode 12 by the differential output driver 18 in response to signals from the phase splitter 20 which changes phase at a frequency (the "chop frequency") controlled by the ring oscillator 22 all as described in more detail below.

The ring oscillator 22 is made from an odd number of current inverters 22a, 22b, 22c, 22d, 22e coupled in a loop. Examples of ring oscillators and explanations as to how they operate can be found in U.S. Pat. No. 6,025,756 and U.S. Pat. No. 5,357,217, the complete disclosures of which are hereby incorporated herein by reference.

As shown in FIG. 1, one of the current inverters, 22e, is provided with hysteresis which is used to control the duty cycle by making the previous current inverter, 22d, have a different slew rate for high to low transition than from low to high transition. According to a presently preferred embodiment, a 25% duty cycle in the ring oscillator 22 keeps the laser diode ON for 75% of the time. The frequency of the laser diode is nominally 300–500 Mhz.

The phase splitter 20 is coupled by its input 20c to the ring oscillator 22 and provides two output signals 20a, 20b which are substantially 180 degrees out of phase with each other. When one is high, the other is low and they change at exactly the same time in response to the output of the ring oscillator.

The differential output driver 18 includes two switching transistors 24, 26 which are driven (via their gate connections 24b, 26b) by the outputs 20a, 20b of the phase splitter 20 such that one transistor is OFF when the other is ON and they change at exactly the same time. More particularly, the gate 24b of the first transistor 24 is coupled to the first output 20a of the phase splitter 20 and the drain 24c of the first transistor 24 is coupled (via lead 18a) to the anode 12a of the laser diode 12. The gate 26b of the second transistor 26 is coupled to the second output 20b of the phase splitter 20 and the drain 26c of the second transistor 26 is coupled (via lead 18b) to the cathode 12b of the laser diode 12. The sources 24e, 26e of both transistors 24, 26 are coupled to the programmable current source 16.

The programmable current source 16 is programmable via the connection 16a shown in FIG. 1. A current applied to the connection 16a is multiplied by the programmable current source 16 to provide the appropriate laser drive current which depends on other system requirements such as the nature of the laser diode 12 and the application to which the system will be applied. According to the presently preferred embodiment, the gain supplied, by the programmable current source 16 is nominally a factor of twenty-five.

From the foregoing, those skilled in the art will appreciate that the differential output driver 18 steers the current from the programmable current source 16 either to the laser diode 12 (when it is coupled to the cathode 12b of the laser diode 12) or to Vcc (when it is coupled to the anode 12a of the laser diode 12). Thus, the current is never turned OFF. This is an important feature of the invention which significantly minimizes RF radiation from the circuit.

Turning now to FIG. 2, according to a presently preferred embodiment, the circuit 10 of the invention is implemented as an integrated circuit chip 30 which is mounted in die form very close to the laser diode 12 in a leadframe package 32, and coupled to anode 12a and cathode 12b of laser diode 12 (shown in FIG. 1), via leads 18a and 18b, respectively. In the example shown, the package 32 has sixteen pins 101–116. As shown in FIG. 2, the laser diode 12 is mounted on a second integrated circuit chip 34 which also contains a monitoring diode 36 and photodetectors 38. The monitoring diode 36 is coupled to conventional circuitry including an amplifier (not shown) on the integrated circuit chip 30 via the lead 36a. The photodetectors 38 are coupled to conventional circuitry 40 on the chip 30, including amplifiers (not shown), via leads 38a. Those skilled in the art will appreciate that the package 32 also included various optics (not shown) associated with the laser diode 12 and the photodetectors 38. These optics are conventional and well known in the art of laser readable disks and laser guided data retrieval. Those skilled in the art will also appreciate that the very short connections (for example, wire bonded connections or other connections within the same leadframe), between the integrated circuit chip 30 and the integrated circuit chip 34, minimize RF emissions.

There have been described and illustrated herein a chopped laser driver for low noise applications and single leadframe package contain the circuit together with photodetectors and other circuits for use in optical data retrieval.

While particular embodiments of the invention have been described, it is not intended that the invention be limited thereto, as it is intended that the invention be as broad in scope as the art will allow and that the specification be read likewise. Thus, while particular a particular number of inverters have been shown with reference to the ring oscillator, it will be appreciated that a different number could be utilized. Also, while a duty cycle of 25% for the ring oscillator has been disclosed, it will be recognized that a somewhat different duty cycle could be used with similar results obtained.

Moreover, while particular configurations have been disclosed in reference to the programmable current source, it will be appreciated that other configurations could be used as well. Furthermore, while the leadframe package has been disclosed as having a certain number of leads, photodetectors, etc., it will be understood that different numbers of leads, photodetectors, etc. can achieve the same or similar function as disclosed herein.

It will therefore be appreciated by those skilled in the art that yet other modifications could be made to the provided invention without deviating from its spirit and scope as so claimed.

What is claimed is:

1. A circuit (10) for driving a laser diode (12), comprising:
   (a) a laser driving current source (16);
   (b) an oscillator means (20, 22) including a ring oscillator having a first inverter provided with hysteresis to cause a second inverter to have different slew rates for high to low transition and low to high transition; and
   (c) a current steering means (18) coupled to said laser driving current source (16) and said oscillator means (20, 22) for alternately coupling said laser driving current source (16) to the anode (12a) and the cathode (12b) of the laser diode (12) in response to said oscillator means (20, 22).

2. A circuit (10) according to claim 1 wherein said laser driving current source (16) is a programmable current source.

3. A circuit (10) according to claim 1 wherein said oscillator (20, 22) means includes a phase splitter (20) having an input (22c) and first (22a) and second (22b) outputs, said first and second outputs (22a, 22b) being substantially 180 degrees out of phase with each other, said input (22c) being coupled to said ring oscillator.

4. A circuit (10) according to claim 3 wherein said current steering means (18) includes a first transistor (24) and a second transistor (26), said first transistor (24) being coupled to said first output (20a) of said phase splitter (20), to said laser driving current source (16), and to means (18a) for coupling to the anode (12a) of the laser diode (12), and said second transistor (26) being coupled to said second output (20b) of said phase splitter (20), to said laser driving current source (16), and to means (18b) for coupling to the cathode (12b) of the laser diode (12).

5. A laser diode circuit (10, 12), comprising:
   (a) a laser diode (12);
   (b) a laser driving current source (16);
   (c) an oscillator means (20, 22) including a ring oscillator having a first inverter provided with hysteresis to cause a second inverter to have different slew rates for high to low transition and low to high transition; and
   (d) a current steering means (18) coupled to said laser driving current source (16), said oscillator means (20, 22), and said laser diode (12) for alternately coupling said laser driving current source (16) to the anode (12a) and the cathode (12b) of the laser diode (12) in response to said oscillator means (20, 22).

6. A circuit (10, 12) according to claim 5 wherein said laser driving current source (16) is a programmable current source.

7. A circuit (10, 12) according to claim 5 wherein said oscillator (20, 22) means includes a phase splitter (20) having an input (22c) and first (22a) and second (22b) outputs, said first and second outputs (22a, 22b) being substantially 180 degrees out of phase with each other, said input (22c) being coupled to said ring oscillator.

8. A circuit (10, 12) according to claim 7 wherein said current steering means (18) includes a first transistor (24) and a second transistor (26), said first transistor (24) being coupled to said first output (20a) of said phase splitter (20), to said laser driving current source (16), and to the anode (12a) of the laser diode (12), and said second transistor (26) being coupled to said second output (20b) of said phase splitter (20), to said laser driving current source (16), and to the cathode (12b) of the laser diode (12).

9. A method for driving a laser diode (12), said method comprising the steps of:
   (a) generating an oscillation frequency (22) by providing a first inverter of an oscillator with hysteresis to cause a second inverter of the oscillator to have different slew rates for high to low transition and low to high transition; and
   (b) alternately coupling (18) a driving current (16) to the anode (12a) and the cathode (12b) of the laser diode (12) in response to said oscillation frequency (22).

10. A method according to claim 9 wherein said oscillation frequency is at least approximately 300 Mhz.

11. A method according to claim 9 further comprising the step of constantly applying a small current (14) to the cathode (12b) of the laser diode (12) to keep it charged.

12. A circuit (10) for driving a laser diode (12), comprising:
   (a) a programmable current source (16);
   (b) a ring oscillator (22) generating a first frequency, the ring oscillator having a first inverter provided with hysteresis to cause a second inverter to have different slew rates for high to low transition and low to high transition, said ring oscillator having an output (22f);
   (c) a phase splitter (20) having an input (22c) and first (22a) and second (22b) outputs, said first and second outputs (22a, 22b) being substantially 180 degrees out of phase with each other, said input (20c) being coupled to said output (22f) of said ring oscillator (22); and
   (d) a differential output driver (18) coupled to said programmable current source (16) and said phase splitter (20) for alternately coupling said programmable current source (16) to the anode (12a) and the cathode (12b) of laser diode (12) in response to said oscillator means (20, 22).

13. A circuit (10) according to claim 12 wherein said differential output driver (18) includes a first transistor (24) and a second transistor (26), said first transistor (24) being coupled to said first output (20a) of said phase splitter (20), to said laser driving current source (16), and to means (18a) for coupling to the anode (12a) of the laser diode (12), and said second transistor (26) being coupled to said second output (20b) of said phase splitter (20), to said laser driving current source (16), and to means (18b) for coupling to the cathode (12b) of the laser diode (12).

14. A circuit (10) according to claim 13 further comprising a fixed current source (14) coupled to the cathode (12b) of the laser diode (12).

* * * * *